(12) United States Patent
Balakumar et al.

(10) Patent No.: US 6,649,486 B1
(45) Date of Patent: Nov. 18, 2003

(54) METHOD TO FORM SHALLOW TRENCH ISOLATIONS

(75) Inventors: Subramanian Balakumar, Singapore (SG); Kong Hean Lee, Singapore (SG); Zheng Zhou, Singapore (SG); Xian Bin Wang, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 109 days.

(21) Appl. No.: 09/679,510

(22) Filed: Oct. 6, 2000

(51) Int. Cl.[7] .............................................. H01L 21/76
(52) U.S. Cl. ...................... 438/424; 438/427; 438/400; 438/712; 438/713; 438/719
(58) Field of Search ................................ 438/424, 427, 438/712, 713, 719, 400

(56) References Cited

U.S. PATENT DOCUMENTS

| | | | |
|---|---|---|---|
| 6,027,982 A | | 2/2000 | Peidous et al. .............. 438/424 |
| 6,037,237 A | * | 3/2000 | Park et al. ................... 438/424 |
| 6,040,231 A | | 3/2000 | Wu .............................. 438/424 |
| 6,057,210 A | | 5/2000 | Yang et al. .................. 438/427 |
| 6,080,637 A | * | 6/2000 | Huang et al. ................ 438/424 |
| 6,110,797 A | * | 8/2000 | Perry et al. .................. 438/221 |
| 6,140,242 A | * | 10/2000 | Oh et al. ..................... 438/698 |
| 6,180,490 B1 | * | 1/2001 | Vassiliev et al. ............ 438/424 |
| 6,261,914 B1 | * | 7/2001 | Divakaruni et al. ........ 438/359 |
| 6,284,623 B1 | * | 9/2001 | Zhang et al. ................ 438/424 |
| 6,287,974 B1 | * | 9/2001 | Miller ......................... 438/706 |

OTHER PUBLICATIONS

Chang et al, ULSI Technology, McGraw–Hill, 1996, p. 215–217.*

* cited by examiner

*Primary Examiner*—Matthew Smith
*Assistant Examiner*—V. Yevsikov
(74) *Attorney, Agent, or Firm*—George O. Saile; Rosemary L. S. Pike; Doglas R. Schnabel

(57) ABSTRACT

A new method of fabricating shallow trench isolations has been achieved. A pad oxide layer is formed overlying a semiconductor substrate. A silicon nitride layer is deposited overlying the pad oxide layer. A protective layer is deposited overlying the silicon nitride layer. The protective layer, the silicon nitride layer, and the pad oxide layer are patterned to expose the semiconductor substrate where shallow trench isolations are planned. The semiconductor substrate is etched to form trenches for the planned shallow trench isolations. A large trench etching angle is used. The presence of the protective layer prevents loss of the silicon nitride layer during the etching. A trench filling layer is deposited overlying the protective layer and filling the trenches. The trench filling layer and the protective layer are polished down to complete the shallow trench isolations in the manufacture of the integrated circuit device.

15 Claims, 4 Drawing Sheets

METHOD TO FORM SHALLOW TRENCH ISOLATIONS

BACKGROUND OF THE INVENTION

1 Field of the Invention

The invention relates to a method of fabricating semiconductor devices, and more particularly, to the fabrication of shallow trench isolation structures in the manufacture of an integrated circuit device.

2 Description of the Prior Art

The use of shallow trench isolation (STI) for the formation of integrated circuit isolations has grown in the art due to the reduced surface area and improved topology of STI when compared to traditional local oxidation of silicon (LOCOS) schemes. However, as the space between active regions shrinks with advancing technology, it is becoming more challenging to form STI.

Referring to FIG. 1, a cross-section of a partially completed prior art integrated circuit is shown. In this first prior art example, trenches 22 and 24 are formed in a semiconductor substrate 10. Prior to formation of the trenches, a pad oxide layer 14 is formed overlying the semiconductor substrate 10. A silicon nitride layer 18 is deposited overlying the pad oxide layer 14. The silicon nitride layer 18 and the pad oxide layer 14 are then patterned to expose the semiconductor substrate 10 where the trenches 22 and 24 are planned.

The trenches 22 and 24 are then etched using an anisotropic dry plasma etching process. In the first prior art example, the trench etch angle 31 is less than about 70 degrees. Note that this angle 31 is sufficient to form the wide trench 22 but is insufficient to form a flat bottom on the narrow trench 24. The silicon nitride layer 18 has a low etching rate in this trench etch process. Therefore, the thickness of the silicon nitride layer 18 is reduced 30 by only a small amount during the etch process. Variation in the thickness of the silicon nitride layer 18 can cause variation in the thickness of the final STI isolation layer because the silicon nitride layer 18 is the polishing stop for the chemical mechanical polish (CMP) process.

Referring now to FIG. 2, a second example of a prior art STI is illustrated. In this example, the trench etch angle 32 is increased to between about 75 degrees and 83 degrees. Note that this etch angle 32 is sufficient to form a flat-bottomed narrow trench 24. However, increasing the trench etching angle brings a disadvantage. By increasing the angle at which the ionic plasma strikes the wafer surface, the etch rate of the silicon nitride layer 18 is also increased. For example, as the trench etch angle increase from 77 degrees to 81 degrees, the silicon nitride layer 18 loss increases from about 300 Angstroms to about 700 Angstroms. The second prior art example therefore exhibits a much greater loss 33 of silicon nitride layer 18 due to the trench etching process. This loss of hard mask material 18 causes inconsistency and non-uniformity in the thickness of the final STI isolation layer. At a minimum, a thicker silicon nitride layer 18 must be deposited to insure that the large angle trench etching process does not punch through. However, increasing the silicon nitride layer 18 thickness also increases the tensile stress and the probability of stress-related device leakage.

Several prior art approaches disclose methods to form shallow trench isolation in the semiconductor substrate. U.S. Pat. No. 6,027,982 to Peidous et al teaches a method to form STI with improved isolation fill and surface planarity. After the trench etch, the silicon nitride masking layer is laterally undercut at the trench edges by etching to thereby expose the substrate surface near the trench edges. A liner oxide layer is then grown in the trenches and the exposed substrate surface. The thin oxide layer overlying the silicon nitride masking layer enables the selective lateral undercutting process. U.S. Pat. No. 6,040,231 to Wu discloses an STI process whereby a pad oxide layer is laterally undercut by etching. Salicide is then formed in the exposed substrate. The salicide is removed to create an a slope periphery on the trenches. U.S. Pat. No. 6,057,210 to Yang et al teaches a method to form STI using an indirect CMP process. After trench formation and filling, the trench filling oxide is etched down by a wet etch. A silicon nitride layer is deposited overlying the filling oxide and is then polished down to expose raised portions of the filling oxide. The exposed filling oxide is removed. The silicon nitride layer is removed to complete the STI.

SUMMARY OF THE INVENTION

A principal object of the present invention is to provide an effective and very manufacturable method of fabricating shallow trench isolations in the manufacture of integrated circuits.

A further object of the present invention is to provide a method to fabricate narrow trenches for shallow trench isolations by facilitating the use of a large trench etching angle process.

A further object of the present invention is to provide a method to use a large trench etching angle while avoiding silicon nitride masking layer loss.

Another further object of the present invention is to reduce variation in STI thickness due to silicon nitride layer loss during the trench etch process.

A yet further object of the present invention is to prevent silicon nitride masking layer loss through the use of an overlying protective layer.

Another yet further object of the present invention is to reduce silicon nitride masking layer loss due to high density plasma sputtering.

In accordance with the objects of this invention, a new method of fabricating shallow trench isolations has been achieved. A pad oxide layer is formed overlying a semiconductor substrate. A silicon nitride layer is deposited overlying the pad oxide layer. A protective layer is deposited overlying the silicon nitride layer. The protective layer, the silicon nitride layer, and the pad oxide layer are patterned to expose the semiconductor substrate where shallow trench isolations are planned. The semiconductor substrate is etched to form trenches for the planned shallow trench isolations. A large trench etching angle is used. The presence of the protective layer prevents etching of the silicon nitride layer during the etching. A trench filling layer is deposited overlying the protective layer and filling the trenches. The trench filling layer and the protective layer are polished down to complete the shallow trench isolations in the manufacture of the integrated circuit device.

BRIEF DESCRIPTION OF THE DRAWINGS

In the accompanying drawings forming a material part of this description, there is shown.

DESCRIPTION OF THE PREFERRED EMBODIMENTS

The method of the present invention is applied to the formation of shallow trench isolation structures in a semiconductor substrate. In should be clear to those experienced in the art that the present invention can be applied and extended without deviating from the scope of the present invention.

Figure 1:
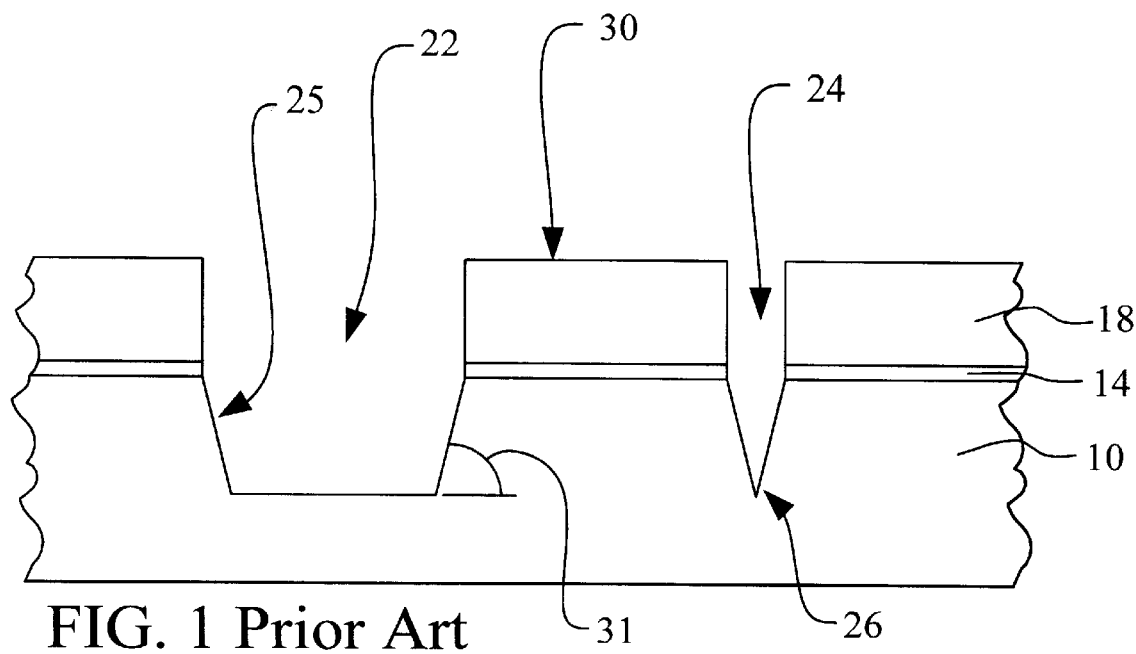
FIGS. 1 and 2 schematically illustrate in cross-section partially completed prior art integrated circuit devices.
Figure 2:
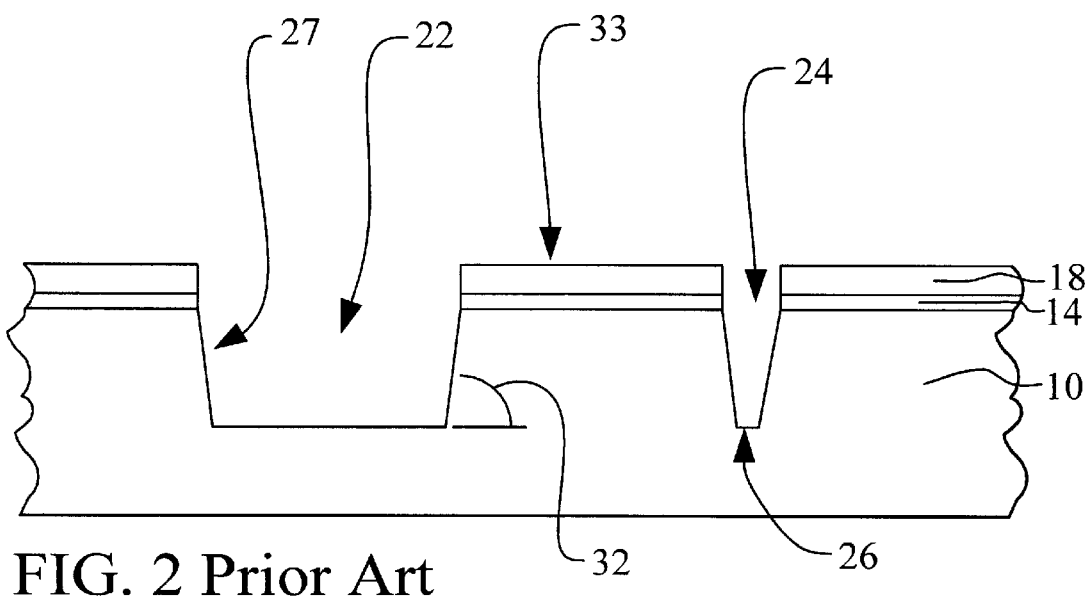
Figure 3:
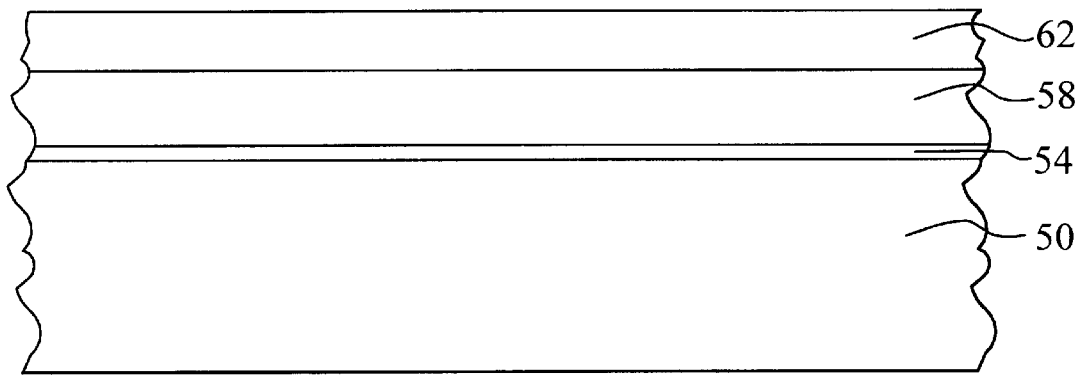
FIGS. 3 through 7 schematically illustrate in cross-sectional representation a preferred embodiment of the present invention.

Referring now more particularly to FIG. 3, there is illustrated a cross-section of a partially completed integrated circuit device of the preferred embodiment. Several important features of the present invention are illustrated. A semiconductor substrate 50 is provided. Preferably, the semiconductor substrate 50 comprises monocrystalline silicon fabricated by methods well known in the art. A pad oxide layer 54 is formed overlying the semiconductor substrate 50. The pad oxide layer 54 is used to improve the adhesion of the subsequently deposited silicon nitride layer. The pad oxide layer 54 is preferably formed by thermal oxidation of the semiconductor substrate 50. The pad oxide layer 54 is preferably formed to a thickness of between about 50 Angstroms and 250 Angstroms.

A silicon nitride layer 58 is next deposited overlying the pad oxide layer 54. The silicon nitride layer 58 serves as a hard mask during trench etching. The silicon nitride layer 58 may be deposited by, for example, a low-pressure chemical vapor deposition (LPCVD) process. It is important to the present invention that the silicon nitride layer 58 be deposited thin enough to keep tensile stress low. By keeping the tensile stress low, the probability of stress-related device leakage is reduced. The ability to use a thinner silicon nitride layer 58 in conjunction with a large trench etching angle is a distinct advantage to the present invention. Therefore, the silicon nitride layer 58 is deposited to a thickness of less than about 1300 Angstroms and preferably between about 600 Angstroms and 1,300 Angstroms. The prior art scheme cannot use such a thin silicon nitride layer with a large trench etching angle process.

A protective layer 62 is deposited overlying the silicon nitride layer 58. The protective layer protects the silicon nitride layer 58 so that the silicon nitride layer 58 is not lost during the trench etch. The protective layer 62 comprises a material of low selectivity to silicon nitride etching and high selectivity to silicon etching. The protective layer 62 preferably comprises silicon dioxide deposited by low-pressure TEOS (LP-TEOS) chemical vapor deposition (CVD). Alternatively, the protective layer 62 may comprise $SiO_xN_y$ (stoichiometric silicon oxynitride), AP (atmospheric pressure) TEOS CVD, or SA (sub-atmospheric) TEOS CVD. Finally, a combination these above films may be used. It is very important that the protective layer 62 be deposited to a great enough thickness to protect the silicon nitride layer Se during the entire trench etch process. Since the protective layer 62 is etched down during the trench etching process, the protective layer 62 must be deposited to a thickness of between about 200 Angstroms and 800 Angstroms. A thinner protective layer 62 will not protect the silicon nitride layer 58 from loss and, therefore, will allow variation in STI thickness after polish down.

Figure 4:
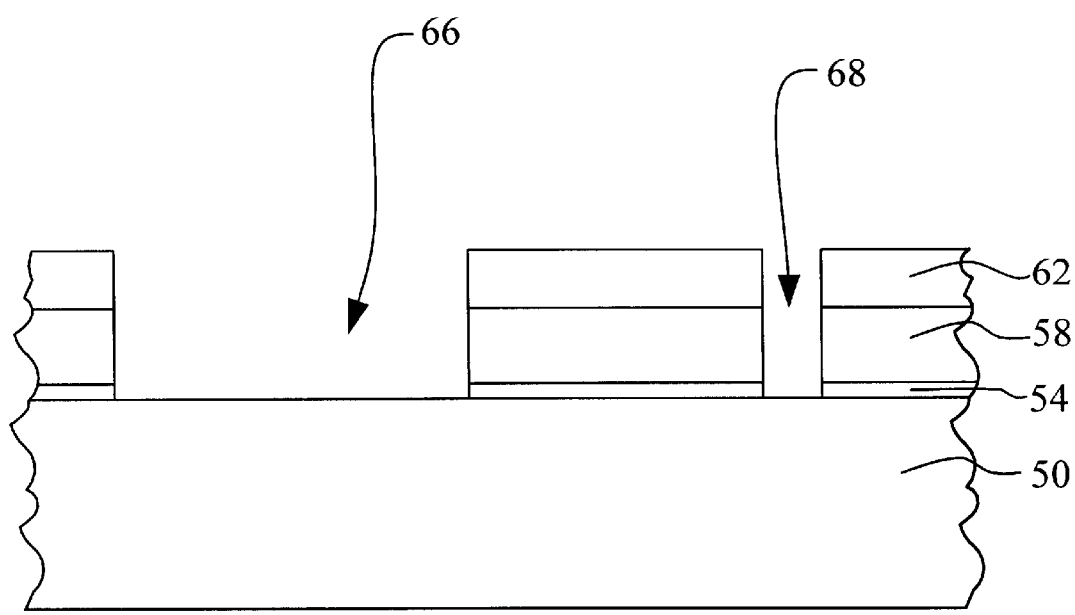

Referring now to FIG. 4, the protective layer 62, the silicon nitride layer 58, and the pad oxide layer 54 are patterned to expose the semiconductor substrate 50 where shallow trench isolations are planned. The patterning is accomplished by, for example, depositing a photoresist layer overlying the protective layer 62. The photoresist layer, not shown, would then be exposed to actinic light through a mask. After development, the protective layer 62 is exposed where trenches are planned. The protective layer 62, the silicon nitride layer 58, and the pad oxide layer 54 are then etched through using, for example, a plasma dry etch process. The silicon nitride layer 58 thereby forms a hard mask for the trench etching step. Finally, the remaining photoresist is stripped away. In the example of the preferred embodiment, wide trenches 66 and narrow trenches 68 are formed.

Figure 5:
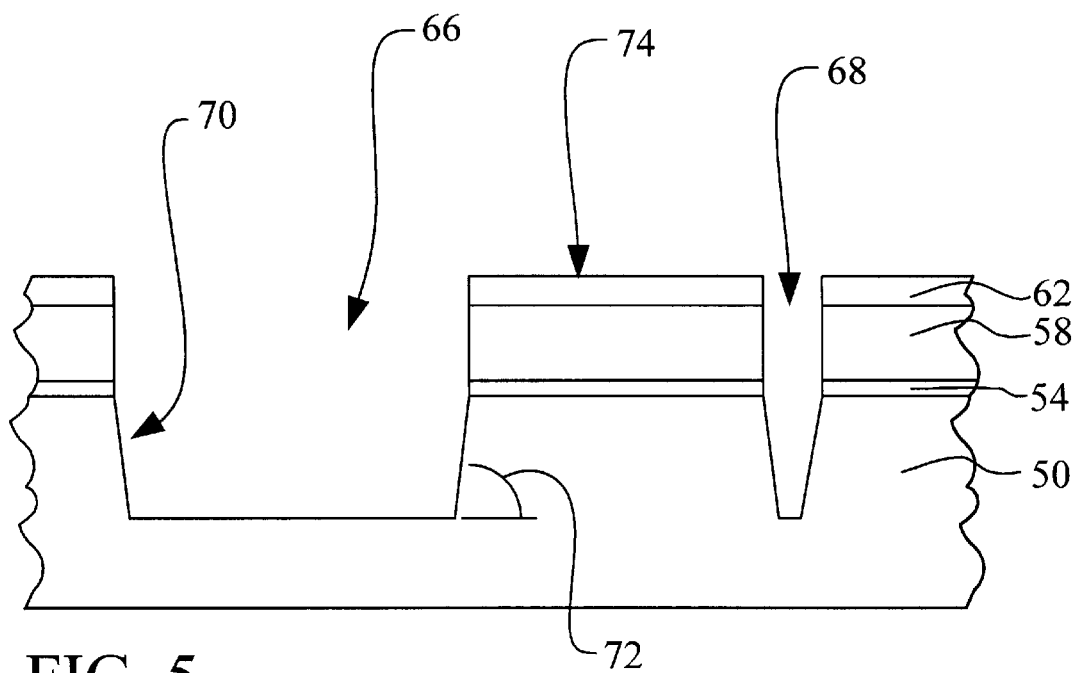

Referring now to FIG. 5, an important feature of the present invention is illustrated. The semiconductor substrate 50 is etched where it is exposed. Trenches 66 and 68 are formed for the planned shallow trench isolations. A large trench etching angle 72 is used. The large trench etching angle 72 produces steep trench sidewalls 70 and a flat bottom in the narrow trenches 68. The etching angle 72 is the angle at which the plasma ions strike the semiconductor substrate 50 surface. Preferably, the large trench etching angle 72 is controlled to between about 75 degrees and 88 degrees.

As noted in the prior art analysis, the use of a large trench etching angle 72 can cause a rapid loss of the silicon nitride layer 58. However, the novel protective layer 62 of the present invention protects the silicon nitride layer 58 for the trench etch. Therefore, no appreciable silicon nitride layer 58 loss occurs. The protective layer 62 is reduced 74 in thickness during the etch. However, since the protective layer 62 is made sufficiently thick, it does not punch through to reveal the underlying silicon nitride layer 58.

Figure 6:
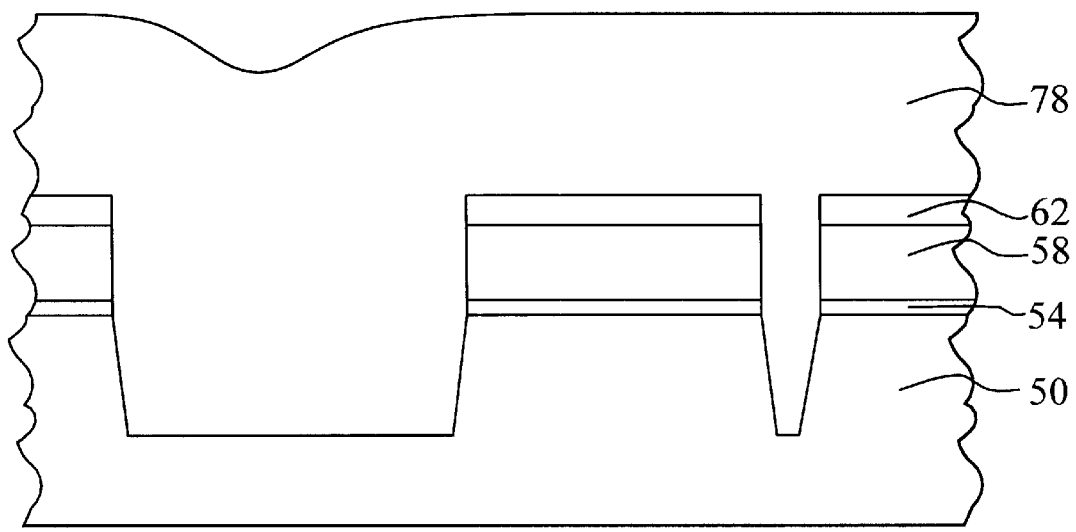

Referring now to FIG. 6, a filling layer 78 is deposited overlying the protective layer 62 and filling the trenches. The filling layer 78 serves as an electrical insulator, or dielectric barrier, for the STI structures. The filling layer 78 preferably comprises a high density plasma (HDP) deposited silicon dioxide layer. HDP oxide exhibits excellent trench filling qualities. Alternatively, LP-TEOS, AP-TEOS, or oxygen-rich $SiO_xN_y$ may be used as the filling layer 78 material.

Note that the presence of the novel protective layer 62 protects the silicon nitride layer 58 during the depositing of the HDP oxide filling layer 78. Such a high density plasma process can cause sputtering of the silicon nitride layer 58 that would reduce the nitride layer thickness. The protective layer 62 prevents the loss of the silicon nitride layer 58 during the HDP process.

Figure 7:
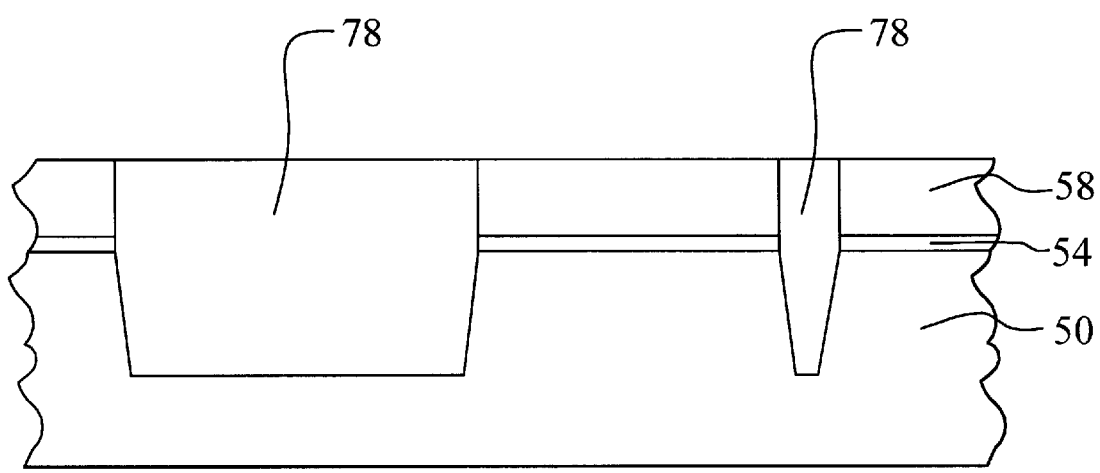

Referring now to FIG. 7, the trench filling layer 78 and the protective layer 62 are polished down to complete the shallow trench isolations in the manufacture of the integrated circuit device. The polishing preferably comprises a chemical mechanical polish (CMP). The silicon nitride layer 58 is the polishing stop. Since the protective layer 62 of the present invention protects silicon nitride layer 58 throughout the trench etching and filling sequence, the thickness of the silicon nitride layer 58 is maintained. Therefore, a uniform STI height is achieved across the device wafer.

The advantages of the process of the present invention can now be enumerated. First, an effective process for forming shallow trench isolation has been achieved. Second, the method allows the use of a large trench etching angle to thereby form very narrow trenches. Third, a protective layer overlies the silicon nitride masking layer so that the large trench etching angle can be used. Fourth, good uniformity of STI thickness is achieved by protecting the silicon nitride layer.

As shown in the preferred embodiment, the present invention provides a very manufacturable process for fabricating shallow trench isolations while protecting the silicon nitride masking layer in the manufacture of an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method of forming trenches for shallow trench isolation structures in an integrated circuit device comprising:

providing a semiconductor substrate;

forming a pad oxide layer overlying said semiconductor substrate;

depositing a silicon nitride layer overlying said pad oxide layer;

depositing a protective layer overlying said silicon nitride layer wherein said protective layer comprises $SiO_xN_y$ (stoichiometric silicon oxynitride);

patterning said protective layer, said silicon nitride layer, and said pad oxide layer to expose said semiconductor substrate where trenches for shallow trench isolations are planned; and etching said semiconductor substrate to complete said trenches in the manufacture of the integrated circuit device wherein the presence of said protective layer prevents loss of said silicon nitride layer during said etching.

2. The method according to claim 1 wherein said pad oxide layer is formed to a thickness of between about 50 Angstroms and 250 Angstroms.

3. The method according to claim 1 wherein said silicon nitride layer is deposited to a thickness of between about 600 Angstroms and 1,300 Angstroms.

4. The method according to claim 1 wherein said protective layer is deposited to a thickness of between about 200 Angstroms and 800 Angstroms.

5. The method according to claim 1 further comprising:

depositing a trench filling layer overlying said protective layer and filling said trenches after said step of etching said semiconductor substrate; and polishing down said trench filling layer and said protective layer.

6. The method according to claim 5 wherein said trench filling layer comprises one of the group of: high density plasma (HDP) oxide, LP-TEOS, AP-TEOS, and oxygen-rich $SiO_xN_y$.

7. A method of forming trenches for shallow trench isolation structures in an integrated circuit device comprising:

providing a semiconductor substrate;

forming a pad oxide layer overlying said semiconductor substrate;

depositing a silicon nitride layer overlying said pad oxide layer;

depositing a protective layer overlying said silicon nitride layer wherein said protective layer comprises $SiO_xN_y$ (stoichiometric silicon oxynitride);

patterning said protective layer, said silicon nitride layer, and said pad oxide layer to expose said semiconductor substrate where trenches for shallow trench isolations are planned; and etching said semiconductor substrate to complete said trenches in the manufacture of the integrated circuit device wherein the presence of said protective layer prevents loss of said silicon nitride layer during said etching.

8. The method according to claim 7 wherein said pad oxide layer is formed to a thickness of between about 50 Angstroms and 250 Angstroms.

9. The method according to claim 7 wherein said silicon nitride layer is deposited to a thickness of between about 600 Angstroms and 1,300 Angstroms.

10. The method according to claim 7 wherein said protective layer is deposited to a thickness of between about 200 Angstroms and 800 Angstroms.

11. The method according to claim 7 further comprising:

depositing a trench filling layer overlying said protective layer and filling said trenches after said step of etching said semiconductor substrate; and polishing down said trench filling layer and said protective layer.

12. The method according to claim 11 wherein said trench filling layer comprises one of the group of: high density plasma (HDP) oxide, LP-TEOS, AP-TEOS, and oxygen-rich $SiO_xN_y$.

13. A method of forming shallow trench isolations in an integrated circuit device comprising:

providing a semiconductor substrate;

forming a pad oxide layer overlying said semiconductor substrate;

depositing a silicon nitride layer overlying said pad oxide layer wherein said silicon nitride layer is deposited to a thickness of between about 600 Angstroms and 1,300 Angstroms;

depositing a protective layer overlying said silicon nitride layer wherein said protective layer comprises $SiO_xN_y$ (stoichiometric silicon oxynitride);

patterning said protective layer, said silicon nitride layer, and said pad oxide layer to expose said semiconductor substrate where shallow trench isolations are planned;

etching said semiconductor substrate to form trenches for said planned shallow trench isolations wherein the presence of said protective layer prevents etching of said silicon nitride layer during said etching;

depositing a trench filling layer overlying said protective layer and filling said trenches; and polishing down said trench filling layer and said protective layer to complete said shallow trench isolations in the manufacture of the integrated circuit device.

14. The method according to claim 13 wherein said pad oxide layer is formed to a thickness of between about 50 Angstroms and 250 Angstroms.

15. The method according to claim 13 wherein said protective layer is deposited to a thickness of between about 200 Angstroms and 800 Angstroms.

* * * * *

UNITED STATES PATENT AND TRADEMARK OFFICE
CERTIFICATE OF CORRECTION

PATENT NO.   : 6,649,486 B1
DATED        : November 18, 2003
INVENTOR(S)  : Subramanian Balakumar et al.

It is certified that error appears in the above-identified patent and that said Letters Patent is hereby corrected as shown below:

<u>Title page,</u>
Item [74], *Attorney, Agent, or Firm*, delete "Doglas R. Schnabel" and replace with -- Douglas R. Schnabel --.

Signed and Sealed this

Sixth Day of January, 2004

JAMES E. ROGAN
*Director of the United States Patent and Trademark Office*